(12) United States Patent
Kuma et al.

(10) Patent No.: US 7,777,413 B2
(45) Date of Patent: Aug. 17, 2010

(54) ORGANIC ELECTROLUMINESCENT DEVICE HAVING AN OPTICAL RESONATOR

(75) Inventors: Hitoshi Kuma, Sodegaura (JP); Kenichi Fukuoka, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 317 days.

(21) Appl. No.: 11/908,847

(22) PCT Filed: Mar. 7, 2006

(86) PCT No.: PCT/JP2006/304363

§ 371 (c)(1),
(2), (4) Date: Sep. 17, 2007

(87) PCT Pub. No.: WO2006/098188

PCT Pub. Date: Sep. 21, 2006

(65) Prior Publication Data
US 2009/0230845 A1    Sep. 17, 2009

(30) Foreign Application Priority Data

Mar. 17, 2005 (JP) .............................. 2005-077000

(51) Int. Cl.
H01J 1/62 (2006.01)
(52) U.S. Cl. ......................................... 313/506; 257/40
(58) Field of Classification Search .................. 313/506; 257/40
See application file for complete search history.

(56) References Cited

U.S. PATENT DOCUMENTS

| | | | |
|---|---|---|---|
| 6,505,901 B1 * | 1/2003 | Fukuda | 313/504 |
| 7,023,013 B2 * | 4/2006 | Ricks et al. | 257/40 |
| 7,057,339 B2 * | 6/2006 | Boroson et al. | 313/504 |
| 7,102,282 B1 * | 9/2006 | Yamada et al. | 313/506 |
| 2004/0056590 A1 * | 3/2004 | Lim et al. | 313/506 |
| 2005/0012455 A1 * | 1/2005 | Lee et al. | 313/506 |
| 2005/0225233 A1 * | 10/2005 | Boroson et al. | 313/504 |
| 2005/0274960 A1 * | 12/2005 | Yokoyama et al. | 257/79 |
| 2006/0220540 A1 * | 10/2006 | Lee et al. | 313/506 |

FOREIGN PATENT DOCUMENTS

| | | |
|---|---|---|
| CN | 1578572 A | 2/2005 |
| EP | 1 030 382 A2 | 8/2000 |
| EP | 1 154 676 A1 | 11/2001 |
| JP | 2000-243573 | 9/2000 |
| JP | 2001-195008 | 7/2001 |
| JP | 2003-123987 | 4/2003 |
| JP | 2005-44778 | 2/2005 |
| JP | 2005-150042 | 6/2005 |
| WO | WO 01/039554 | 5/2001 |

* cited by examiner

Primary Examiner—Peter Macchiarolo
(74) Attorney, Agent, or Firm—Oblon, Spivak, McClelland, Maier & Neustadt, L.L.P.

(57) ABSTRACT

An organic electroluminescent device including a first electrode (11), a second electrode (16), and an organic material layer (20) interposed therebetween; the second electrode (16) being light-transmissible; the organic material layer (20) having a structure wherein a first carrier transporting layer (12), an organic emitting layer (14) and a second carrier transporting layer (15) are stacked in this order; the organic material layer (20) including a conductive light-reflecting layer (13) therein; and the part between the light-transmissible second electrode (16) and the light-reflecting layer (13) forming an optical resonator enhancing light emitted from the organic emitting layer (14).

6 Claims, 3 Drawing Sheets

ORGANIC ELECTROLUMINESCENT DEVICE HAVING AN OPTICAL RESONATOR

TECHNICAL FIELD

The invention relates to an organic electroluminescent device. In detail, it relates to an organic electroluminescent device enabling emission with a high efficiency by providing a light-reflecting layer between two electrodes to enhance the intensity of specific light.

BACKGROUND

An organic electroluminescent device (hereinafter "electroluminescent" is abbreviated as "EL") has a structure wherein an organic layer formed by stacking an organic carrier transporting layer and an organic emitting layer is arranged between first and second electrodes. Attention is paid to the device as a self-emission type display element which can emit light with a high luminance by low voltage direct current driving.

The cross section structure of the organic EL device is categorized as a bottom-emission structure or a top-emission structure according to a light-outcoupling direction.

In the top-emission structure, light is outcoupled from the side opposite to a substrate, differing from a conventional structure (bottom emission) in which light is outcoupled through a glass substrate supporting an organic EL device. This improves the aperture ratio in an emitting part, whereby the luminance can be increased.

A method has been studied in which a semitransparent cathode is used as an upper electrode and only light having a specific wavelength is intensified by utilizing a multiple interference effect and outcoupled from the EL device to achieve high color reproducibility.

For example, Patent document 1 discloses an organic EL device in which a first electrode formed of a light-reflecting material, an organic layer including an organic emitting layer, and a second electrode formed of a semitransparent reflecting layer and a transparent material are stacked such that the organic layer serves as a resonator, and which device satisfies the following formula (1) when λ is the peak wavelength of the spectrum of light intended to be outcoupled.

$$(2L)/\lambda + \phi/(2\pi) = m \quad (1)$$

wherein L is an optical length, λ is a wavelength of light intended to be outcoupled, m is an integer, φ is a phase shift in electrodes, and the optical length L is adjusted to be a positive minimum.

There is disclosed a full color display formed by combining such a top-emission type organic EL device and a thin film transistor (TFT) array for actively driving this organic EL device (see Patent document 2, for example).

In the technique disclosed in Patent document 1, since the organic layer provided between the first and second electrodes has a small thickness, a short circuit between the two electrodes is caused by influence of surface unevenness of the first electrode, reducing a fabrication yield of the organic EL device.

Specifically, FIG. 4 shows the relationship between the thickness of the organic layer and m of the formula (1).

FIG. 4 shows the relationship between the thickness of the organic layer (x+50) (nm) and m of the formula (1) for light having a wavelength of 455 nm (B), 520 nm (G) and 620 nm (R) in the organic EL device of aluminum/ITO (10 nm)/hole transporting layer (x nm)/emitting layer (30 nm)/electron transporting layer (20 nm)/Mg—Ag alloy layer (10 nm)/ITO (100 nm). The relationship was obtained by calculation.

FIG. 4 shows that a short circuit between the two electrodes tends to occur due to the thin thickness of the organic layer of 100 nm or less in the case of light having a short wavelength of 520 nm or less.

As a technique for preventing a short circuit between electrodes, there is known a technique of smoothing the surface of a first electrode by polishing. This is effective for a bottom-emission type device. However, when the technique is applied to a top emission-type device, in particular a device where a top-emission structure is provided on the upper part of a TFT alley as shown in Patent document 2, static electricity caused by polishing may break the TFT alley part.

As another technique for preventing a short circuit between electrodes, an organic layer is thickened. If the thickness is selected such that m is 1 in FIG. 4, a short circuit can be prevented while reinforcing the intensity of light by utilizing a multiple interference effect.

However, a luminous efficiency decreases in the case of the thick film of m=1 compared with the case of the thin film of m=0.

FIG. 5 shows the relationship between a light-outcoupling efficiency (ratio of light outcoupled from an organic EL device to the outside) and the thickness of a hole transporting layer. Specifically, FIG. 5 shows the relationship between a light-outcoupling efficiency for light having a wavelength of 455 nm emitted from an emitting layer and the thickness x of a hole transporting layer in an organic EL device of aluminum/ITO (10 nm)/hole transporting layer (x nm)/emitting layer (30 nm)/electron transporting layer (20 nm)/Mg—Ag alloy layer (10 nm)/ITO (100 nm). The relationship was obtained by calculation.

FIG. 5 shows that the light-outcoupling efficiency becomes maximum when the hole transporting layer has a thickness of 36 nm (m of the formula (1) is 0) or 152 nm (m of the formula (1) is 1). The two maximum values are substantially the same. That is, the light-outcoupling efficiencies are almost the same for the specific wavelengths. However, a high light-outcoupling efficiency is required over a relatively wide wavelength region because light emitted from an organic EL device generally has a broad spectrum.

FIG. 6 is a graph showing the wavelength dependency of light-outcoupling efficiency and the emission spectrum of organic EL device.

Specifically, FIG. 6 shows the wavelength dependency of light-outcoupling efficiency in the two cases where a hole transporting layer has thicknesses of 36 nm (m=0) and 152 nm (m=1) in the organic EL device of FIG. 5.

Apparently from FIG. 6, the full width at half maximum of the light-outcoupling efficiency in the case of thick film of m=1 is narrower than that in the case of thin film of m=0. An organic EL device generally emits light with a broad emission spectrum. The full width at half maximum in the case of thick film of m=1 is narrower than that of the emission spectrum of organic EL device. This means that light of the shaded region in FIG. 6 can not be outcoupled from the device to the outside, whereby the luminous efficiency is reduced.

As described above, an organic EL device having a high luminous efficiency can not be obtained only by thickening its organic layer.

[Patent document 1] WO01/39554
[Patent document 2] JP-A-2001-195008

In view of the above-described problems, an object of the invention is to provide an organic EL device having a high luminous efficiency while preventing a short circuit between a first electrode and a second electrode.

SUMMARY OF INVENTION

Through an intensive study, the inventors found that a high luminous efficiency can be realized while preventing a short circuit by further providing a conductive light-reflecting layer between a first electrode and a second electrode.

According to the invention, the following organic EL device and display are provided.

1. An organic electroluminescent device comprising:
   a first electrode,
   a second electrode, and
   an organic material layer interposed therebetween;
   the second electrode being light-transmissible;
   the organic material layer having a structure wherein a first carrier transporting layer, an organic emitting layer and a second carrier transporting layer are stacked in this order;
   the organic material layer comprising a conductive light-reflecting layer therein; and
   the part between the light-transmissible second electrode and the light-reflecting layer forming an optical resonator enhancing light emitted from the organic emitting layer.
2. The organic electroluminescent device according to 1 wherein the part between the first electrode and the second electrode and/or the part between the first electrode and the light-reflecting layer forms an optical resonator enhancing light emitted from the organic emitting layer.
3. The organic electroluminescent device according to 1 or 2 wherein the light-reflecting layer is positioned between first carrier transporting layers.
4. The organic electroluminescent device according to 3 wherein the first carrier transporting layer comprise 2 or more carrier transporting layers formed of different carrier transporting materials, and the light-reflecting layer is positioned between different carrier transporting layers.
5. The organic electroluminescent device according to 4 wherein a carrier transporting layer of the first carrier transporting layer positioned between the first electrode and the light-reflecting layer is a layer doped with a material having a function of producing carriers.
6. The organic electroluminescent device according to any one of 1 to 5 wherein the light-reflecting layer is positioned apart from the organic emitting layer by 10 nm or more.
7. An organic electroluminescent device comprising a first electrode, a planarization layer positioned so as to cover the first electrode, a conductive light-reflecting layer, an organic material layer and a second electrode in this order;
   the second electrode being light-transmissible;
   the organic material layer having a structure wherein a first carrier transporting layer, an organic emitting layer and a second carrier transporting layer are stacked in this order;
   the first electrode layer being electrically connected to the light-reflecting layer; and
   the part between the second electrode and the light-reflecting layer forming an optical resonator enhancing light emitted from the organic emitting layer.
8. A display comprising the organic electroluminescent device of any one of 1 to 7.

The organic EL device of the invention can prevent a short circuit between electrodes and improve a fabrication yield. The organic EL device of the invention can also have a high luminous efficiency.

BEST MODE FOR CARRYING OUT THE INVENTION

Embodiment 1

The organic EL device according to the invention is described below with reference to the drawings.

Figure 1:
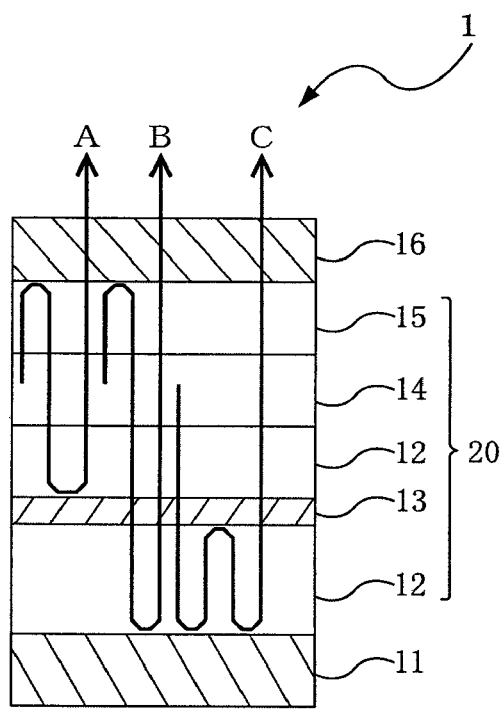
FIG. 1 is a schematic view showing an organic EL device of a first embodiment according to the invention.

FIG. 1 is a schematic view showing an organic EL device of a first embodiment according to the invention.

An organic EL device 1 has a structure wherein a first electrode 11, an organic material layer 20 and a second electrode 16 are stacked in this order on a supporting substrate (not shown). The organic material layer 20 is formed of first carrier transporting layers 12, an organic emitting layer 14 and a second carrier transporting layer 15. A light-reflecting layer 13 is formed between the first carrier transporting layers 12.

The first electrode 11 has a function of injecting carriers into the first carrier transporting layers 12. Specifically, the first electrode 11 functions as an anode for injecting holes or a cathode for injecting electrons.

The first electrode 11 is preferably a light-reflecting electrode so that light emitted from the organic emitting layer 14 is efficiently outcoupled to the outside of the device. Specifically, the first electrode 11 has preferably a reflectance for light to be outcoupled from the device of 30% or more, more preferably 50% or more.

The second electrode 16 has a function of injecting carriers into the second carrier transporting layer 15. Specifically, the second electrode 16 functions as an anode for injecting holes or a cathode for injecting electrons. The second electrode is a cathode when the first electrode 11 is an anode, whereas the second electrode is an anode when the first electrode 11 is a cathode. Since the organic EL device of the present embodiment is a top-emission type device wherein light emitted from the organic emitting layer 14 appears through the second electrode 16, the second electrode 16 is light transmissive. Specifically, its light transmittance for light to be outcoupled to the outside of the device is preferably 30% or more, more preferably 50% or more.

The second electrode 16 is required to be also light reflective for forming an optical resonator with the light-reflecting layer 13 described later. Specifically, the light reflectance for light to be outcoupled to the outside of the device is preferably 20% or more, more preferably 40% or more.

The first carrier transporting layers 12 and the second carrier transporting layer 15 are a layer which receives carriers from each electrode and transport the carriers to the organic emitting layer 14. The first carrier transporting layers 12 or the second carrier transporting layer 15 may function as a hole transporting layer or an electron transporting layer. In the case where the first electrode 11 is an anode and the second electrode 16 is a cathode, the first carrier transporting layers 12 function as a hole transporting layer and the second carrier transporting layer 15 function as an electron transporting layer. Conversely, in the case where the first electrode 11 is a cathode and the second electrode 16 is an anode, the first carrier transporting layers 12 function as an electron transporting layer and the second carrier transporting layer 15 functions as a hole transporting layer.

Carriers, which are injected from the first electrode 11 and the second electrode 16 through the carrier transporting layers, combine with each other (a pair of electron and hole) to generate energy. The organic emitting layer 14 is excited by receiving the energy to emit light.

The layer 13 is required to be light reflective so as to form an optical resonator with the second electrode 16. The light reflectance of the layer 13 is preferably 10% or more, more preferably 30% or more.

The light reflectance is preferably 80% or less, more preferably 60% or less. In order to obtain a light reflectance of more than 80%, the light-reflecting layer must be thickened, leading to too low a resistance in the plane surface direction of the layer. As a result, in the case where a light-emitting apparatus is fabricated by placing such devices of the present embodiment on a plane, it may be difficult to ensure insulation between adjacent pixels.

The light-reflecting layer 13 is electrically conductive in order to receive carriers injected from the first carrier transporting layer 12 on the first electrode 11 side and transport the carriers to the first carrier transporting layer 12 on the organic emitting layer 14 side.

An optical resonator is formed in the region sandwiched between the second electrode 16 and the light-reflecting layer 13. Specifically, the optical distance (L) between the second electrode 16 and the light-reflecting layer 13 substantially satisfies the following formula (1):

$$(2L)/\lambda + \phi/(2\pi) = m \qquad (1)$$

wherein L is an optical length, $\lambda$ is a wavelength of light to be outcoupled, m is an integer, and $\phi$ is a phase shift in electrodes.

In the device having the optical resonator, light generated in the organic emitting layer 14 is repeatedly reflected between the two light-reflecting surfaces (the second electrode 16 and the light-reflecting layer 13) so that light having a wavelength near a wavelength satisfying the formula (1) is enhanced in comparison with light having other wavelengths, and outcoupled from the device (the light path of the enhanced light is indicated as A in FIG. 1).

The optical distance L is the product ($nL_R$) of the refractive index n and the actual geometrical distance $L_R$ of a medium through which light passes.

In the present embodiment, the thickness of the first carrier transporting layer 12 can be thickened without changing the optical distance of the optical resonator formed between the light-reflecting layer 13 and the second electrode 16 because the light-reflecting layer 13 is formed between the first carrier transporting layers 12. That is, the first carrier transporting layer 12 between the light-reflecting layer 13 and the first electrode 11 can be thickened. Therefore, the distance between the first electrode 11 and the second electrode 16 can be maintained large and a short circuit between both the electrodes can be prevented.

In the present embodiment, the optical resonator may be additionally formed between the first electrode 11 and the second electrode 16, and/or between the first electrode 11 and the light-reflecting layer 13. For example, the optical distance of the optical resonator formed between the light-reflecting layer 13 and the second electrode 16 is adjusted such that m of the formula (1) is 0, and the optical distance of the optical resonator formed between the first electrode 11 and the second electrode 16 is adjusted such that m of the formula (1) is 1.

In this case, among light generated in the organic emitting layer 14, light having a wavelength near a wavelength satisfying the formula (1) is selectively enhanced not only in the optical resonator between the second electrode 16 and the light-reflecting layer 13 but also in the optical resonator between the first electrode 11 and the second electrode 16 (the light path of the enhanced light is indicated as B in FIG. 1).

Such structure enables the wider spectrum full width at half maximum of the light-outcoupling efficiency in comparison with a device without the light-reflecting layer 13 because the structure has the optical resonator of m=0 in the formula (1). As a result, the luminous efficiency of the organic EL device can be improved.

Likewise, an optical resonator may be formed between the first electrode 11 and the light-reflecting layer 13. The light path in this case is indicated as C in FIG. 1.

Although the light-reflecting layer 13 is provided between the first carrier transporting layers 12 in the present embodiment, the position of the light-reflecting layer is not limited thereto. For example, the light-reflecting layer may be provided between second carrier transporting layers 15, at the interface between the first carrier transporting layer 12 and the organic emitting layer 14 or the like.

Since the light-reflecting layer 13 has light reflectivity and electric conductivity, it is preferable that the layer 13 be positioned apart from the organic emitting layer 14 by 10 nm or more. When the distance between the light-reflecting layer 13 and the organic emitting layer 14 is less than 10 nm, dipole energy in the organic emitting layer 14 which has received energy of electron-hole pairs may be influenced by an image force generated by the conductivity of the light-reflecting layer 13, resulting in attenuation. The luminous efficiency of the organic EL device may be then impaired.

Embodiment 2

Figure 2:
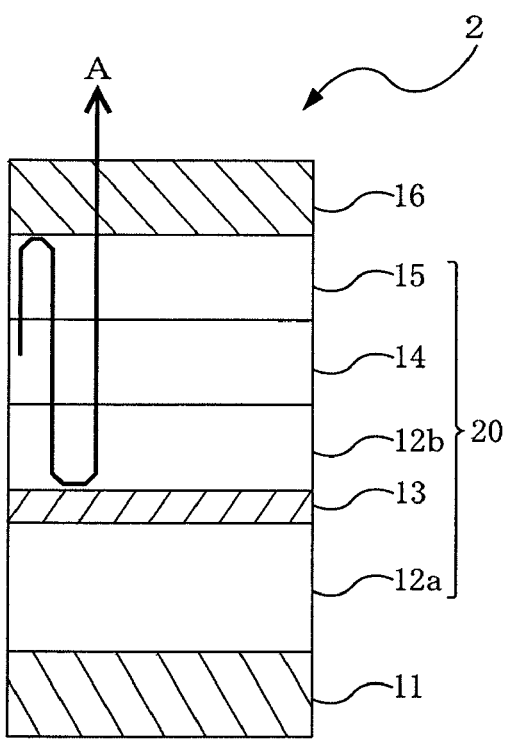
FIG. 2 is a schematic view showing an organic EL device of a second embodiment according to the invention.

FIG. 2 is a schematic view showing an organic EL device of a second embodiment according to the invention.

An organic EL device 2 is the same as the above-mentioned organic EL device 1 except that the first carrier transporting layers 12 separated by the light-reflecting layer 13 are formed of different materials (a first carrier transporting layer 12a and a first carrier transporting layer 12b in FIG. 2) Thus, description on the other layers is omitted.

If the part between the light-reflecting layer 13 and the second electrode 16 functions as an optical resonator by adjusting the distance therebetween such that m of the formula (1) is 0, and the distance between the first electrode 11 and the second electrode 16 is maintained large, the layer between the first electrode 11 and the light-reflecting layer 13 has a high resistance, thereby increasing the driving voltage of the organic EL device. Therefore, in the present embodiment the first carrier transporting layer 12a provided between the first electrode 11 and the light-reflecting layer 13 has a high carrier mobility.

Specifically, in the case where the first carrier transporting layer 12a is a hole transporting layer, it is preferable that its hole mobility be $10^{-3}$ cm$^2$/V·s or more at an electric field intensity of about 0.6 (V/cm), for example.

Specific examples of a material having a high hole mobility include known hole transporting materials doped with materials having a function of producing carriers such as acceptor compounds.

As specific examples of the acceptor compounds, the materials of the following a to g can be given. The hole transporting materials will be described later.
a. Inorganic materials such as Au, Pt, W, Ir, $POCl_3$, $AsF_6$, Cl, Br and I
b. Compounds having cyano groups such as TCNQ (7,7,8,8-tetracyanoquinodimethane), $TCNQF_4$ (tetrafluorotetracyanoquinodimethane), TCNE (tetracyanoethylene), HCNB (hexacyanobutadiene) and DDQ (dicyclodicyanobenzoquinone)
c. Compounds having nitro groups such as TNF (trinitrofluorenone), DNF (dinitrofluorenone) and dicyano TCNQ
d. Organic materials such as fluoranil, cluoranil and bromanil
e. Lewis acids represented by boron-containing acceptor
f. Ketones and thioketones
g. Organic salts such as carboxylic metallic salts In the case where the first carrier transporting layer 12$a$ is an electron transporting layer, specific examples of materials having a high electron mobility include known electron transporting materials doped with materials having a function of producing carriers such as donor compounds.

As specific examples of the donor compounds, the materials of the following a to c can be given. The electron transporting materials will be described later.
a. Inorganic materials such as alkali metals, alkaline earth metals, rare earth elements, Al, Ag, Cu and In
b. Compounds having an aromatic tertiary amine skelton such as anilines, phenylenediamines, benzidines (N,N,N',N'-tetraphenylbenzidine, N,N'-bis-(3-methylphenyl)-N,N'-bis-(phenyl)-benzidine, N,N'-di(naphthalene-1-yl)-N,N'-diphenyl-benzidine and the like), triphenylamines (triphenylamine, 4,4'4"-tris(N,N-diphenyl-amino)-triphenylamine, 4,4'4"-tris(N-3-methylphenyl-N-phenyl-amino)-triphenylamine, 4,4'4"-tris(N-(1-naphthyl)-N-phenyl-amino)-triphenylamine and the like) and triphenyldiamines (N,N'-di-(4-methyl-phenyl)-N,N'-diphenyl-1,4-phenylenediamine and the like)
c. Organic materials such as condensed polycyclic compounds including pyrene, perylene, anthracene, tetracene and pentacene, and TTFs (tetrathiafulvalenes)
d. Complex compounds of alkali metals such as Li chelates, alkaline earth metals and rare earth metals Embodiment 3

Figure 3:
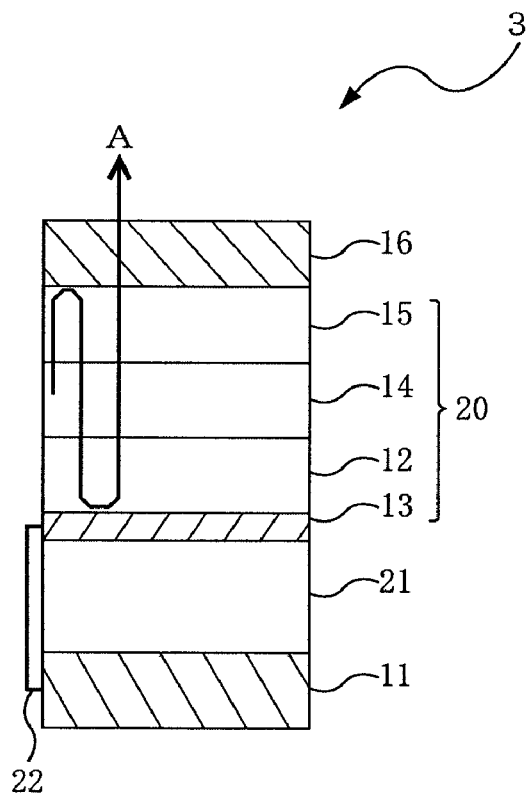
FIG. 3 is a schematic view showing an organic EL device of a third embodiment according to the invention.
Figure 4:
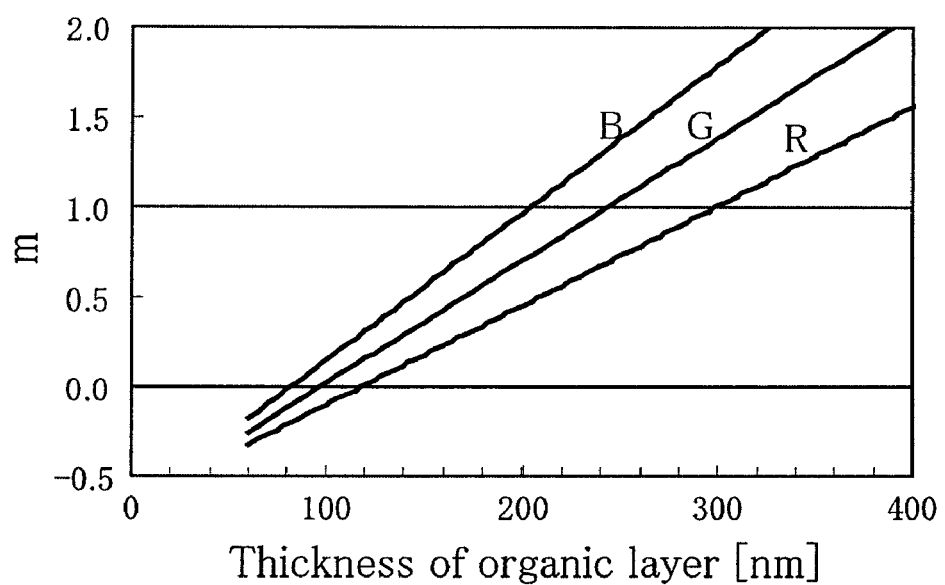
FIG. 4 is a view showing the relationship between the thickness of an organic layer and m of a formula (1).
Figure 5:
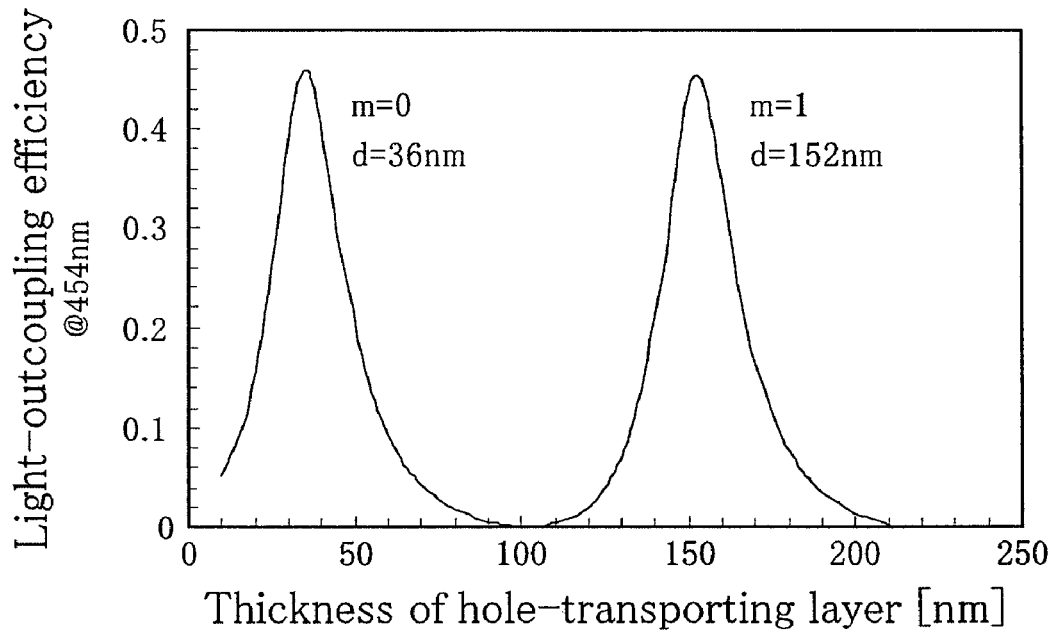
FIG. 5 is a view showing the relationship between a light-outcoupling efficiency and the thickness of a hole transporting layer.
Figure 6:
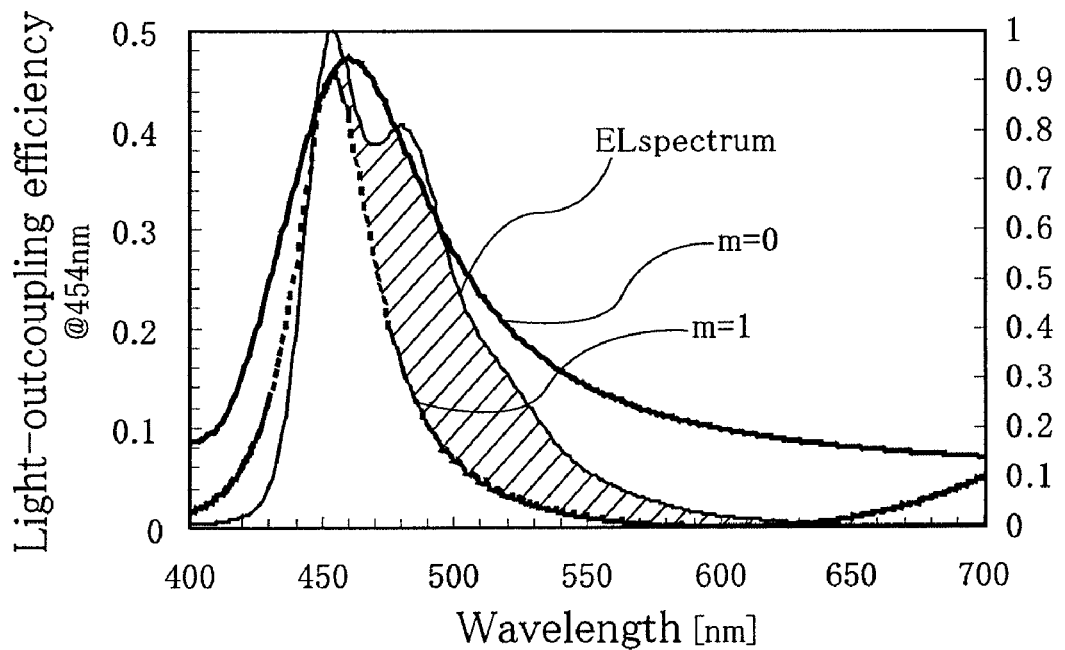
FIG. 6 is a view showing the wavelength dependency of a light-outcoupling efficiency and the emission spectrum of an organic EL device.

FIG. 3 is a schematic view showing an organic EL device of a third embodiment according to the invention.

An organic EL device 3 has a structure wherein a first electrode 11, an insulative planarization layer 21, an organic layer 20 and a second electrode 16 are stacked in this order. The organic EL device 3 is the same as in the second embodiment except that the insulative planarization layer 21 is formed instead of the first carrier transporting layer 12$a$. Therefore, description of the other layers is omitted. In the present embodiment, the first electrode 11 is electrically connected to the light-reflecting layer 13 at a connection part 22.

In the present embodiment, the insulative planarization layer 21 is provided between the first electrode 11 and the light-reflecting layer 13. The planarization layer 21 is for reducing the surface roughness of the first electrode 11 and preventing a short circuit between the electrodes.

Furthermore, the first electrode 11 is electrically connected to the light-reflecting layer 13 outside the light emitting region. As methods for connecting the first electrode 11 to the light-reflecting layer 13, known methods can be applied. For example, a resist film is formed in a non-light-emitting region, an electrical insulative film is formed, a via hole is formed by lifting off the resist film, and then the via hole is filled with a conductive material by deposition and the like.

As materials of the planarization layer 21, any organic materials or inorganic materials may be used so far as the material can cover surface unevenness of the first electrode 11. For example, there can be preferably used a film formed from SiN, SiON or the like, which are used as an insulative material in the semiconductor field, by chemical vapor deposition (CVD method).

Although the EL devices of the above-mentioned embodiments are examples of a top-emission type EL device, the invention can also be applied to a bottom-emission type EL device. Specifically, for example, the light-reflecting first electrode 11 and the light transmissible second electrode 16 are replaced with each other.

Each member of the organic EL device according to the invention is described below.

1. Supporting Substrate

A supporting substrate is a member which is provided below the first electrode to support the organic EL device, TFT or the like. Therefore, the substrate is preferably excellent in mechanical strength and dimension stability. As examples of the substrate, a glass plate, a metal plate, a ceramic plate, a plastic plate (e.g. polycarbonate resin, acrylic resin, vinyl chloride resin, polyethylene terephthalate resin, polyimide resin, polyester resin, epoxy resin, phenol resin, silicon resin, and fluororesin), and the like can be given.

It is preferable that the substrate formed of such a material be subjected to moisture-proof treatment or hydrophobic treatment by forming an inorganic film or applying a fluororesin in order to prevent water from entering a color-light-emitting-apparatus. In particular, the substrate preferably has a small water content and gas permeability coefficient in order to avoid the invasion of moisture into an organic luminescent medium layer. Specifically, it is preferable to adjust the water content of the supporting substrate to 0.0001 wt % or less, and adjust the gas permeability coefficient to $1 \times 10^{-13}$ cc·cm/cm$^2$·sec·cmHg or less. In a top-emission type EL device, since EL emission is outcoupled from the side opposite to the supporting substrate (i.e. through the second transparent electrode), the supporting substrate need not necessarily exhibit transparency.

2. First Electrode and Second Electrode

In the case where the first electrode or the second electrode is an anode, the anode is required to supply a voltage from a driving power source to the organic EL device and inject holes into the hole injecting layer. Therefore, the anode preferably uses a metal, an alloy, an electrically conductive compound, a mixture thereof or a multilayer body thereof that has a low resistance and large work function (4.0 eV or more, for example).

Specifically, there can be used one or a combination of two or more selected from indium tin oxide (ITO), indium zinc oxide (IZO), CuI (copper iodide), $SnO_2$ (tin oxide), zinc oxide, Au, Pt, Pd, Al, Cr, Ni, Nd and like.

In the case where the first electrode or the second electrode functions as a cathode, a metal, an alloy, an electrically conductive compound or a mixture thereof that has a small work function (less than 4.0 eV, for example) is preferably used for enhancing electron-injecting properties.

Specifically, there can be used one or a combination of two or more selected from Mg, Al, In, Li, Na, Ca, Ce, Ag and the like.

In addition, super thin films formed of the above-mentioned metals and metal oxides such as aluminum oxide, and super thin films formed of halides of alkali metals such as Li, Ce and K can be used.

The thickness of the cathode layer is not limited but is preferably 10 to 1,000 nm, more preferably 10 to 200 nm.

It is required for outcoupling light that at least one of the anode and the cathode have a light transmissibility.

3. Organic Material Layer

The organic material layer is mainly formed of the organic emitting layer, the first carrier transporting layer and the second carrier transporting layer, but is not limited thereto. The organic material layer may comprise a known functional layer such as an adhesion improving layer, as required. The organic material layer may comprise an inorganic material layer.

(3-1) Organic Emitting Layer

The material of the organic emitting layer preferably has the following three functions in combination:

(a) Carrier injecting function: function of allowing injection of holes from an anode or hole-injecting layer and injection of electrons from a cathode or electron-injecting layer upon application of electric field (b) Transporting function: function of moving injected (electrons and holes) due to force of electric field (c) Emitting function: function of providing a site for recombination of electrons and holes to emit light The invention can be applied regardless of emission color so far as light is visible. The organic emitting layer may have a monolayer structure, or a multilayer structure wherein 2 or more emitting layers, which emit light of the same emission color or different emission colors, are stacked. The preferable materials for an emitting layer of each color will be described below.

(A) Blue Emitting Layer

The blue emitting layer contains a host material and a blue dopant.

The host material is preferably a styryl derivative, an anthracene derivative, or an aromatic amine. The styryl derivative is in particular preferably at least one selected from distyryl derivatives, tristyryl derivatives, tetrastyryl derivatives, and styrylamine derivatives. The anthracene derivative is preferably an asymmetric anthracene compound. The aromatic amine is preferably a compound having 2 to 4 nitrogen atoms which are substituted with an aromatic group, and is in particular preferably a compound having 2 to 4 nitrogen atoms which are substituted with an aromatic group, and having at least one alkenyl group.

The asymmetric anthracene compound preferably includes compounds represented by the following formula. The methods of preparing the above-mentioned compounds are specifically described in Japanese Patent Application No. 2004-042694.

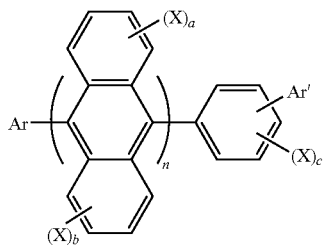

wherein Ar is a substituted or unsubstituted condensed aromatic group having 10 to 50 nucleus carbon atoms, Ar' is a substituted or unsubstituted aryl group having 6 to 50 nucleus carbon atoms, X is a substituted or unsubstituted aryl group having 6 to 50 nucleus carbon atoms, substituted or unsubstituted aromatic heterocyclic group having 5 to 50 nucleus atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus atoms, a substituted or unsubstituted arythio group having 5 to 50 nucleus atoms, a substituted or unsubstituted alkoxycarbonyl group having 1 to 50 carbon atoms, a carboxyl group, a halogen atom, a cyano group, a nitro group or a hydroxyl group.

a, b and c are each an integer of 0 to 4; and n is an integer of 1 to 3.

Examples of the substituted or unsubstituted condensed aromatic group of Ar in the above formula include 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 3-methyl-2-naphthyl, 4-methyl-1-naphthyl, and 4-methyl-1-anthryl groups.

Examples of the substituted or unsubstituted aryl group for Ar', and the aryl, aromatic heterocyclic, alkyl, alkoxy, aralkyl, aryloxy, arylthio and alkoxycarbonyl groups for X in the above formula include the following compounds.

Examples of the substituted or unsubstituted aryl groups include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, and 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the substituted or unsubstituted aromatic heterocyclic group include a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 10-phenothiadinyl group, 1-phenoxadinyl group, 2-phenoxadinyl group, 3-phenoxadinyl group, 4-phenoxadinyl group, 10-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butyl-pyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, cyclopropyl group, cyclobutyl group, cyclopentyl group, cyclohexyl group, 4-methylcyclohexyl group, 1-adamantyl group, 2-adamantyl group, 1-norbornyl group, and 2-norbornyl group.

The substituted or unsubstituted alkoxy group is represented by —OY. Examples of Y include the same groups as the above-mentioned examples for the substituted or unsubstituted alkyl groups.

Examples of the substituted or unsubstituted aralkyl group include the above-mentioned substituted or unsubstituted aryl groups which are substituted by the above-mentioned substituted or unsubstituted alkyl groups.

The substituted or unsubstituted aryloxy group is represented by —OY'. Examples of Y' include the same groups as the above-mentioned examples for the substituted or unsubstituted aryl groups.

The substituted or unsubstituted arylthio group is represented by —SY'. Examples of Y' include the same groups as the above-mentioned examples for the substituted or unsubstituted aryl groups.

The substituted or unsubstituted alkoxy carbonyl group is represented by —COOY. Examples of Y include the same groups as the above-mentioned examples for the substituted or unsubstituted alkyl groups.

As the halogen atom, fluorine, chlorine, bromine and iodine can be given.

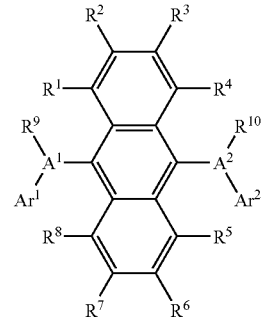

wherein $A^1$ and $A^2$ are independently a substituted or unsubstituted condensed aromatic ring group having 10 to 20 nucleus carbon atoms, $Ar^1$ and $Ar^2$ are independently a hydrogen atom or a substituted or unsubstituted aryl group with 6 to 50 nucleus carbon atoms, $R^1$ to $R^{10}$ are independently a substituted or unsubstituted aryl group having 6 to 50 nucleus carbon atoms, substituted or unsubstituted aromatic heterocyclic group having 5 to 50 nucleus atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus atoms, a substituted or unsubstituted arylthio group having 5 to 50 nucleus atoms, a substituted or unsubstituted alkoxycarbonyl group having 1 to 50 carbon atoms, a carboxyl group, a halogen atom, a cyano group, a nitro group or a hydroxyl group.

provided that groups do not symmetrically bond to 9 and 10 positions of the central anthracene.

Examples of the substituted or unsubstituted condensed aromatic group for $A^1$ and $A^2$ in the above formula include the same groups mentioned above.

Examples of the substituted or unsubstituted aryl group for $A^1$ and $A^2$ in the above formula include the same groups mentioned above.

Examples of the substituted or unsubstituted aryl group, aryl, aromatic heterocyclic, alkyl, alkoxy, aralkyl, aryloxy, arylthio and alkoxycarbonyl groups for $R^1$ to $R^{10}$ in the above formula include the following compounds.

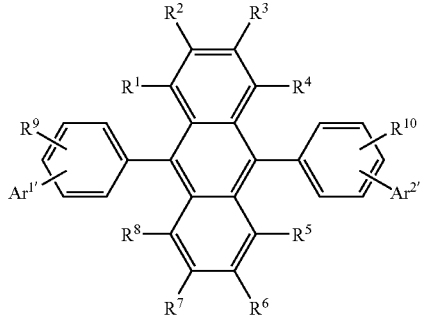

wherein $Ar^{1'}$ and $Ar^{2'}$ are independently a substituted or unsubstituted aryl group having 6 to 50 nucleus carbon atoms; $R^1$ to $R^{10}$ are independently a substituted or unsubstituted aryl group having 6 to 50 nucleus carbon atoms, substituted or unsubstituted aromatic heterocyclic group having 5 to 50 nucleus atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus atoms, a substituted or unsubstituted arythio group having 5 to 50 nucleus atoms, a substituted or unsubstituted alkoxycarbonyl group having 1 to 50 carbon atoms, a carboxyl group, a halogen atom, a cyano group, a nitro group or a hydroxyl group.

Examples of the substituted or unsubstituted aryl group for $A^{1'}$ and $A^{2'}$ in the above formula include the same groups mentioned above.

Examples of the substituted or unsubstituted aryl group, aromatic heterocyclic, alkyl, alkoxy, aralkyl, aryloxy, arylthio and alkoxycarbonyl groups for $R^1$ to $R^{10}$ in the above formula include the following compounds.

Examples of substituents for each group in the above three formulas include halogen atoms, hydroxyl, nitro, cyano, alkyl, aryl, cycloalkyl, alkoxy, aromatic heterocyclic, aralkyl, aryloxy, arylthio, alkoxycarbonyl and carboxyl groups.

The blue dopant is preferably at least one selected from styrylamines, amine-substituted styryl compounds, amine-substituted condensed aromatic rings and condensed-aromatic-ring containing compounds. The blue dopant may be formed of plural different compounds. Examples of the styrylamines and amine-substituted styryl compounds are compounds represented by formulas (1) and (2), and examples of the condensed-aromatic-ring containing compounds are compounds represented by formula (3).

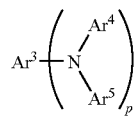 (1)

wherein $Ar^3$, $Ar^4$ and $Ar^5$ are independently a substituted or unsubstituted aromatic group having 6 to 40 carbon atoms, and p is an integer of 1 to 3.

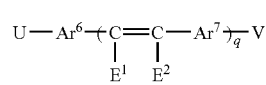 (2)

wherein $Ar^6$ and $Ar^7$ are independently an arylene group having 6 to 30 carbon atoms, $E^1$ and $E^2$ are independently an aryl or alkyl group having 6 to 30 carbon atoms, a hydrogen atom or a cyano group; q is an integer of 1 to 3; and U and/or V is a substituent containing an amino group and the amino group is preferably an arylamino group.

 (3)

wherein A is an alkyl or alkoxy group having 1 to 16 carbon atoms, a substituted or unsubstituted aryl group having 6 to 30 carbon atoms, a substituted or unsubstituted alkylamino group having 6 to 30 carbon atoms or a substituted or unsubstituted arylamino group having 6 to 30 carbon atoms; B is a condensed aromatic ring group having 10 to 40 carbon atoms; and r is an integer of 1 to 4.

(B) Green Emitting Layer

The green emitting layer contains a host material and a green dopant.

The host material of the green emitting layer is preferably the same as that of the blue emitting layer.

The dopant is not particularly limited, and, for example, the following can be used: coumalin derivatives disclosed in EP-A-0281381, JP-A-2003-249372, and others; and aromatic amine derivatives wherein a substituted anthracene structure and an amine structure are linked to each other.

(C) Orange-to-red Emitting Layer

An orange-to-red emitting layer contains a host material and an orange-to-red dopant.

The host material of the orange-to-red emitting layer is preferably the same as that of the blue emitting layer.

As the dopant, there can be used a fluorescent compound having at least one fluoranthene skeleton or perylene skeleton, for example, compounds represented by the following formula.

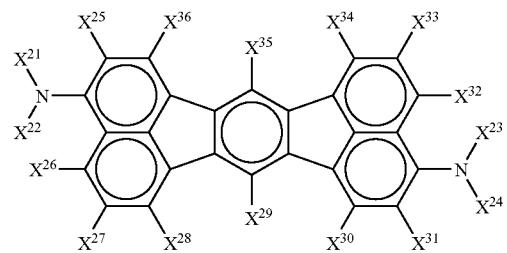

wherein $X^{21}$ to $X^{24}$ are independently an alkyl group having 1 to 20 carbon atoms, a substituted or unsubstituted aryl group having 6 to 30 carbon atoms; $X^{21}$ and $X^{22}$ and/or $X^{23}$ and $X^{24}$ may be bonded to each other having a carbon to carbon bond, —O— or —S— therebetween; $X^{25}$ to $X^{36}$ are a hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms or a substituted or unsubstituted alkenyl group having 8 to 30 carbon atoms; and adjacent substituents and $X^{25}$ to $X^{36}$ may be bonded together to form a ring structure; and at least one of the substituents $X^{25}$ to $X^{36}$ in each formula preferably contains an amino or alkenyl group.

The thickness of the organic emitting layer is preferably 5 nm to 5 µm. If the thickness is less than 5 nm, luminance and durability may be decreased. If the thickness exceeds 5 µm, a applied voltage may be higher. The thickness is more preferably 10 nm to 3 µm, still more preferably 20 nm to 1 µm.

(3-2) First Carrier Transporting Layer and Second Carrier Transporting Layer

The first carrier transporting layer or the second carrier transporting layer is one of a hole transporting layer and an electron transporting layer. As mentioned above, in the case where the first electrode is an anode and the second electrode is a cathode, the first carrier transporting layer functions as a hole transporting layer and the second carrier transporting layer functions as an electron transporting layer.

Conversely, in the case where the first electrode is a cathode and the second electrode is an anode, the first carrier transporting layer functions as an electron transporting layer and the second carrier transporting layer functions as a hole transporting layer.

The first and second carrier transporting layers may each have a monolayer structure or a multilayer structure of two or more layers. For example, the carrier transporting layer may have a two layer structure of a hole (electron) transporting layer and a hole (electron) injecting layer.

The material can be arbitrarily selected from materials which have been widely used as a hole-transporting material of photoconductive materials and known materials used in a hole-injecting layer of organic EL devices. The material of the hole transporting layer has a hole transporting property or an electron blocking property, and may be an organic material or an inorganic material.

The hole-transporting layer is preferably made of a material that can transport holes to the emitting layer at a lower electric field intensity. Namely, the hole mobility thereof is preferably $10^{-4}$ cm$^2$/V·second or more when an electric field of $10^4$ to $10^6$ V/cm is applied.

Specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

It suffices that the material of the electron transporting layer has a function of transporting electrons injected from the cathode to the emitting layer. As the material, known compounds can be used.

The thickness of electron-transporting layer may be properly selected from several nm to several µm but is preferably selected such that the electron mobility is $10^{-5}$ cm$^2$/Vs or more when an electric field of $10^4$ to $10^6$ V/cm is applied. The material used in the electron-transporting layer is preferably a metal complex of 8-hydroxyquinoline or a derivative thereof.

As specific examples of a metal complex of 8-hydroxyquinoline or an 8-hydroxyquinoline derivative, metal chelate oxinoid compounds including a chelate of oxine (8-quinolinol or 8-hydroxyquinoline) (Alq, for example) can be given.

An electron transporting compound of the following formula can be given as the oxadiazole derivative.

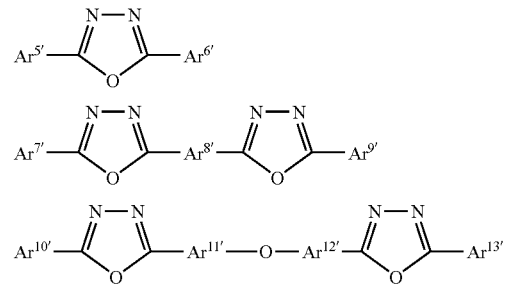

wherein $Ar^{5'}$, $Ar^{6'}$, $Ar^{7'}$, $Ar^{9'}$, $Ar^{10'}$ and $Ar^{13'}$ each represent a substituted or unsubstituted aryl group and may be the same or different, and $Ar^{8'}$, $Ar^{11'}$ and $Ar^{12'}$ represent a substituted or unsubstituted arylene group and may be the same or different.

As examples of the aryl group, a phenyl group, a biphenyl group, an anthranyl group, a perylenyl group, and a pyrenyl group can be given. As examples of the arylene group, a phenylene group, a naphthylene group, a biphenylene group, an anthranylene group, a perylenylene group, a pyrenylene group, and the like can be given. As the substituent, an alkyl group having 1 to 10 carbon atoms, an alkoxy group having 1 to 10 carbon atoms, a cyano group, and the like can be given. The electron transporting compound is preferably one from which a thin film can be formed.

The following compounds can be given as specific examples of the electron transporting compound.

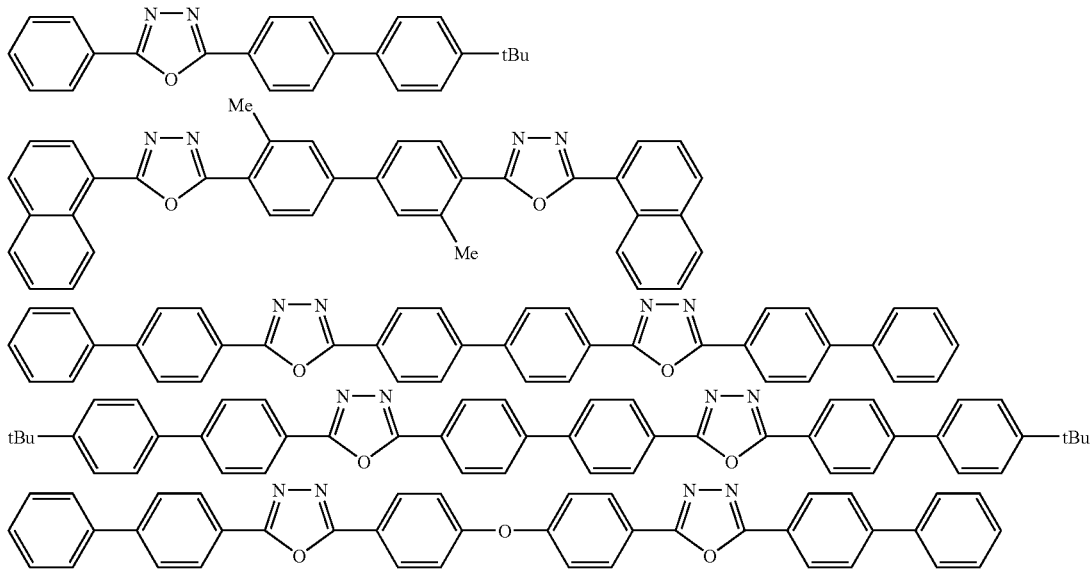

Me indicates a methyl group and tBu indicates a t-butyl group.

Nitrogen-containing heterocyclic derivatives of the following formulas

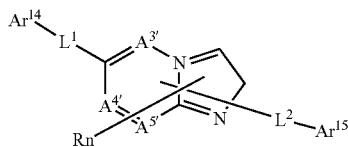

wherein $A^{3'}$ to $A^{5'}$ are a nitrogen atom or a carbon atom;

R is a substituted or unsubstituted aryl group having 6 to 60 carbon atoms, a substituted or unsubstituted heteroaryl group having 3 to 60 carbon atoms, an alkyl group having 1 to 20 carbon atoms, a haloalkyl group having 1 to 20 carbon atoms, or an alkoxy group having 1 to 20 carbon atoms, and n is an integer of 0 to 5, provided that, when n is an integer of 2 or more, Rs may be the same or different;

adjacent Rs may be bonded to form a substituted or unsubstituted carbocyclic aliphatic ring or a substituted or unsubstituted carbocyclic aromatic ring;

$Ar^{14}$ is a substituted or unsubstituted aryl group having 6 to 60 carbon atoms or a substituted or unsubstituted heteroaryl group having 3 to 60 carbon atoms;

$Ar^{15}$ is a hydrogen atom, an alkyl group having 1 to 20 carbon atoms, a haloalkyl group having 1 to 20 carbon atoms, an alkoxy group having 1 to 20 carbon atoms, a substituted or unsubstituted aryl group having 6 to 60 carbon atoms, or a substituted or unsubstituted heteroaryl group having 3 to 60 carbon atoms;

provided that one of $Ar^{14}$ and $Ar^{15}$ is a substituted or unsubstituted condensed ring group having 10 to 60 carbon atoms or a substituted or unsubstituted heterocondensed ring group having 3 to 60 carbon atoms;

$L^1$ and $L^2$ are independently a single bond, a substituted or unsubstituted condensed ring having 6 to 60 carbon atoms, a substituted or unsubstituted hetero condensed ring having 3 to 60 carbon atoms or a substituted or unsubstituted fluorenylene group.

Nitrogen-containing heterocyclic derivatives of the following formulas

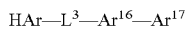

wherein HAr is a substituted or unsubstituted nitrogen-containing heterocycle having 3 to 40 carbon atoms, $L^3$ is a single bond, a substituted or unsubstituted arylene group having 6 to 60 carbon atoms, a substituted or unsubstituted hetero arylene group having 3 to 60 carbon atoms or a substituted or unsubstituted fluorenylene group.

$Ar^{16}$ is a substituted or unsubstituted divalent aromatic hydrocarbon group having 6 to 60 carbon atoms, $Ar^{17}$ is a substituted or unsubstituted aryl group having 6 to 60 carbon atoms or a substituted or unsubstituted heteroaryl group having 3 to 60 carbon atoms.

An electroluminescent device using a silacyclopentadiene derivative represented by the following formula, disclosed in JP-A-09-087616:

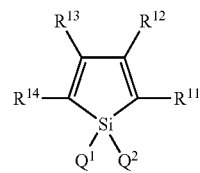

wherein $Q^1$ and $Q^2$ are independently a saturated or unsaturated hydrocarbon group having 1 to 6 carbon atoms, an alkoxy group, an alkenyloxy group, an alkynyloxy group, a hydroxyl group, a substituted or unsubstituted aryl group, or a substituted or unsubstituted hetero ring, or $Q^1$ and $Q^2$ are bonded to form a saturated or unsaturated ring, and $R^1$ to $R^{14}$ are independently hydrogen, halogen, a substituted or unsubstituted alkyl group having 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group, or a cyano group, and adjacent groups of $R^{11}$ to $R^{14}$ form a substituted or unsubstituted condensed ring. Silacyclopentadiene derivatives of the following formula disclosed in JP-A-09-194487

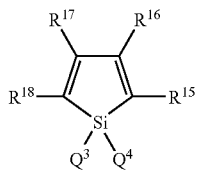

wherein $Q^3$ and $Q^4$ are independently a saturated or unsaturated hydrocarbon group having 1 to 6 carbon atoms, alkoxy group, alkenyloxy group, alkynyloxy group, substituted or unsubstituted aryl group, or substituted or unsubstituted hetero ring, or $Q^3$ and $Q^4$ are bonded to form a saturated or unsaturated ring, and $R^{15}$ to $R^{18}$ are independently hydrogen, halogen, substituted or unsubstituted alkyl group having 1 to 6 carbon atoms, alkoxy group, aryloxy group, perfluoroalkyl group, perfluoroalkoxy group, amino group, alkylcarbonyl group, arylcarbonyl group, alkoxycarbonyl group, aryloxycarbonyl group, azo group, alkylcarbonyloxy group, arylcarbonyloxy group, alkoxycarbonyloxy group, aryloxycarbonyloxy group, sulfinyl group, sulfonyl group, sulfanyl group, silyl group, carbamoyl group, aryl group, heterocyclic group, alkenyl group, alkynyl group, nitro group, formyl group, nitroso group, formyloxy group, isocyano group, cyanate group, isocyanate group, thiocyanate group, isothiocyanate group, or cyano group, or adjacent groups of $R^{15}$ to $R^{18}$ form a substituted or unsubstituted condensed ring, (provided that, when $R^{15}$ and $R^{18}$ are phenyl groups, $Q^3$ and $Q^4$ are neither an alkyl group nor a phenyl group, when $R^{15}$ and $R^{18}$ are thienyl groups, a case is excluded in which $Q^3$ and $Q^4$ are monovalent hydrocarbon groups and $R^{16}$ and $R^{17}$ are an alkyl group, an aryl group, an alkenyl group, or $R^{16}$ and $R^{17}$ are aliphatic groups which form a ring by bonding to each other, when $R^{15}$ and $R^{18}$ are silyl groups, $R^{16}$, $R^{17}$, $Q^3$, and $Q^4$ are neither independently a monovalent hydrocarbon group having 1 to 6 carbon atoms nor a hydrogen atom, and when a benzene ring is condensed at the positions of $R^{15}$ and $R^{16}$, $Q^3$ and $Q^4$ are neither an alkyl group nor a phenyl group).

Borane derivatives of the following formula disclosed in JP-T-2000-040586

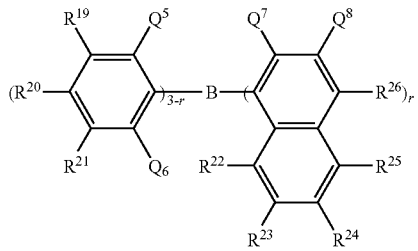

wherein $R^{19}$ to $R^{26}$ and $Q^8$ are individually a hydrogen atom, a saturated or unsaturated hydrocarbon group, an aromatic group, a heterocyclic group, a substituted amino group, a substituted boryl group, an alkoxy group, or an aryloxy group, $Q^5$, $Q^6$, and $Q^7$ are individually a saturated or unsaturated hydrocarbon group, an aromatic group, a heterocyclic group, a substituted amino group, an alkoxy group, or an aryloxy group, the substituents for $Q^7$ and $Q^8$ may be bonded to form a condensed ring, r is an integer of 1 to 3, provided that the $Q^7$s may differ when r is 2 or more, and a case in which r is 1, $Q^5$, $Q^6$, and $R^{20}$ are methyl groups, and $R^{26}$ is a hydrogen atom or a substituted boryl group, and a case in which r is 3 and $Q^7$ is a methyl group are excluded.

Compounds of the following formula disclosed in JP-A-10-088121

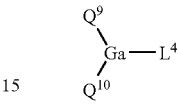

wherein $Q^9$ and $Q^{10}$ are individually ligands of the following formula, $L^4$ is a halogen atom, a substituted or unsubstituted alkyl group, a substituted or unsubstituted cycloalkyl group, a substituted or unsubstituted aryl group, a substituted or unsubstituted heterocyclic group, —$OR^{27}$ ($R^{27}$ is a hydrogen atom, a substituted or unsubstituted alkyl group, a substituted or unsubstituted cycloalkyl group, a substituted or unsubstituted aryl group, or a substituted or unsubstituted heterocyclic group), or —O—Ga-$Q^{11}(Q^{12})$ ($Q^{11}$ and $Q^{12}$ have the same meanings as $Q^9$ and $Q^{10}$).

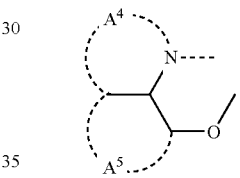

wherein rings $A^4$ and $A^5$ are each a 6-membered aryl ring structure which may have a substituent, and are condensed to each other.

The metal complexes have the strong nature of an n-type semiconductor and large ability of injecting electrons. Further the energy generated at the time of forming a complex is small so that a metal is then strongly bonded to ligands in the complex formed and the fluorescent quantum efficiency becomes large as the emitting material Specific examples of the substituents for the rings $A^4$ and $A^5$ forming the ligand of the above formula include halogen atoms such as chlorine, bromine, iodine, and fluorine, substituted or unsubstituted alkyl groups such as a methyl group, ethyl group, propyl group, butyl group, sec-butyl group, tert-butyl group, pentyl group, hexyl group, heptyl group, octyl group, stearyl group, and trichloromethyl group, substituted or unsubstituted aryl groups such as a phenyl group, naphthyl group, 3-methylphenyl group, 3-methoxyphenyl group, 3-fluorophenyl group, 3-trichloromethylphenyl group, 3-trifluoromethylphenyl group, and 3-nitrophenyl group, substituted or unsubstituted alkoxy groups such as a methoxy group, n-butoxy group, tert-butoxy group, trichloromethoxy group, trifluoroethoxy group, pentafluoropropoxy group, 2,2,3,3-tetrafluoropropoxy group, 1,1,1,3,3,3-hexafluoro-2-propoxy group, and 6-(perfluoroethyl)hexyloxy group, substituted or unsubstituted aryloxy groups such as a phenoxy group, p-nitrophenoxy group, p-tert-butylphenoxy group, 3-fluorophenoxy group, pentafluorophenyl group, and 3-trifluoromethylphenoxy group, substituted or unsubstituted alkylthio groups such as a methylthio group, ethylthio group, tert-butylthio group, hexylthio group, octylthio group, and trifluoromethylthio group, substituted or unsubstituted arylthio groups such as a phenylthio group, p-nitrophenylthio group, p-tert-butylphenylthio group, 3-fluorophenylthio group, pentafluorophenylthio group, and 3-trifluoromethylphenylthio group, a cyano group, a nitro group, an amino group, mono- or di-substituted amino groups such as a methylamino group, diethylamino group, ethylamino group, diethylamino group, dipropylamino group, dibutylamino group, and diphenylamino group, acylamino groups such as a bis(acetoxymethyl) amino group, bis(acetoxyethyl) amino group, bis(acetoxypropyl) amino group, and bis(acetoxybutyl)amino group, a hydroxyl group, a siloxy group, an acyl group, carbamoyl groups such as a methylcarbamoyl group, dimethylcarbamoyl group, ethylcarbamoyl group, diethylcarbamoyl group, propylcarbamoyl group, butylcarbamoyl group, and phenylcarbamoyl group, a carboxylic acid group, a sulfonic acid group, an imide group, cycloalkyl groups such as a cyclopentane group and a cyclohexyl group, aryl groups such as a phenyl group, naphthyl group, biphenyl group, anthranyl group, phenanthryl group, fluorenyl group, and pyrenyl group, heterocyclic groups such as a pyridinyl group, pyrazinyl group, pyrimidinyl group, pyridazinyl group, triazinyl group, indolinyl group, quinolinyl group, acridinyl group, pyrrolidinyl group, dioxanyl group, piperidinyl group, morpholidinyl group, piperazinyl group, carbazolyl group, furanyl group, thiophenyl group, oxazolyl group, oxadiazolyl group, benzooxazolyl group, thiazolyl group, thiadiazolyl group, benzothiazolyl group, triazolyl group, imidazolyl group, and benzimidazolyl group, and the like. The above substituents may be bonded to form a six-membered aryl ring or heterocyclic ring.

4. Light-reflecting Layer

Since the light-reflecting layer has a function of receiving carriers from one surface thereof and releasing the carriers from the other surface thereof, the layer is required to be conductive as well as light reflective. Therefore, the light-reflecting layer is preferably a metal film or a semiconductive film. Among these, a metal film is preferable because the metal film exhibits an excellent reflectance in a broad area from blue to red visible regions.

The reflectance of the metal film is determined by the thickness d, the complex refractive index n-iκ, and the surface roughness (RMS roughness) σ. The material of the metal film is preferably a material of which the real part n and the imaginary part κ of the complex refractive index (equivalent to light absorption coefficient) are both small. Specific examples thereof include Au, Ag, Cu, Mg, Al, Ni, Pd and alloys thereof. If the thickness d is small, light passes through the metal film and the reflectance decreases.

It is preferable that the thickness of the light-reflective film be 5 nm or more, although the thickness varies depending on the value of the imaginary part κ of the complex refractive index of a metal used.

The large surface roughness a causes diffused reflection of light so that components which are reflected in the direction perpendicular to the emission surface of the organic EL device are reduced. Thus, the surface roughness σ is preferably less than 10 nm, more preferably less than 5 nm.

5. Gas Barrier Layer

It is preferable to provide the gas barrier layer so that the second electrode is covered with the gas barrier layer in order to prevent moisture or oxygen from entering the organic emitting layer. The gas barrier layer is usually formed of a transparent insulator. The gas barrier layer preferably has a configuration in which a desiccating agent, dry gas, or inert liquid such as a fluorinated hydrocarbon is enclosed therein. The gas barrier layer is also preferably an inorganic oxide layer, an inorganic nitride layer, or a layer of nitride of an inorganic acid that exhibits excellent dampproof properties. As examples of such a material, silica, alumina, AlON, SiAlON, SiNx, and the like can be given.

EXAMPLES

The invention is described below in more detail by way of examples.

Example 1

ITO was deposited by sputtering to a thickness of 150 nm on a supporting substrate measuring 150 mm×150 mm×0.7 mm. Further, a metal Al was deposited by sputtering to a thickness of 100 nm. These ITO/aluminum films functioned as a first emitting layer.

The substrate with the first electrode was subjected to ultrasonic cleaning in isopropyl alcohol for 5 minutes, and then cleaned with ultraviolet ozone for 30 minutes. The cleaned substrate with the first electrode was installed in a substrate holder of a vacuum deposition apparatus. Individual molybdenum heating boats were charged in advance with 4,4'-bis[N-(1-naphthyl)-N-phenylamino]biphenyl (NPD) as a hole transporting material, tetrafluorotetracyanoquinodimethane (TCNQF$_4$) as an acceptor compound, a metal Ag as a material for a light-reflecting layer, the following compound (BH) as a host of an emitting material, the following compound (BD) as a blue luminescent dopant, tris(8-quinolinol) aluminum (Alq) as an electron transporting material, LiF as an electron injecting material, and Mg and Ag as a cathode material. An ITO target was placed in another sputtering vessel as a hole injecting supporting material and a cathode lead electrode.

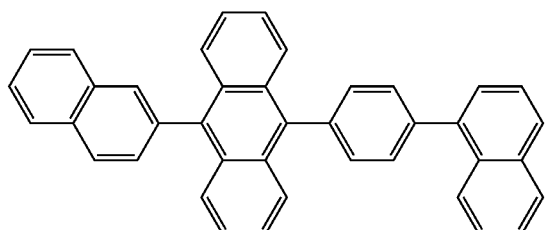

BH

-continued

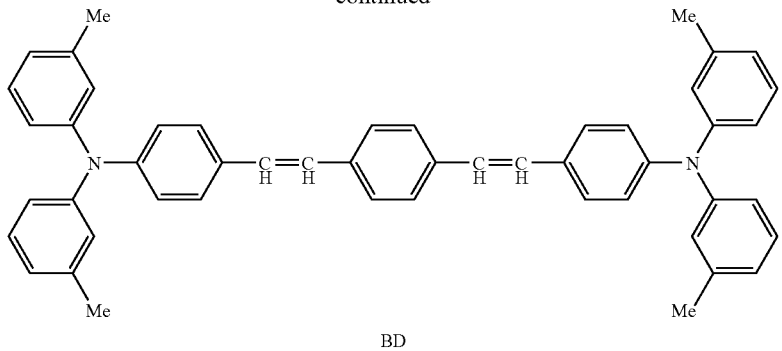

BD

Firstly, a 1 nm thick ITO film was formed by sputtering as a hole injecting supporting layer. Next, NPD and TCNQF$_4$ were co-deposited to a thickness of 130 nm with a thickness ratio of 100:1 as a hole transporting layer. Following the NPD film formation, an Ag film functioning as a light-reflecting layer was deposited to a thickness of 5 nm. Following the Ag film, an NPD film functioning as a hole transporting layer was deposited to a thickness of 20 nm. Following the NPD film, as a blue emitting layer, the compound BH and compound BD were co-deposited to a thickness of 30 nm at a thickness ratio of 100:5. On the film, as an electron transporting layer, an Alq film was deposited to a thickness of 20 nm.

The fluorescence spectrum of the organic emitting layer was measured by the following method.

The compound BH and the compound BD were co-deposited to thickness of 100 nm at a thickness ratio of 100:5 as a blue emitting layer on a 0.7 mm thick glass substrate. Monochromatic light with a wavelength of 410 nm was irradiated to the surface of the blue emitting layer so that the layer emits blue fluorescence. This fluorescence was measured with a spectrophotometer, and the peak wavelength of the fluorescence was 454 nm.

Thereafter, LiF was deposited to a thickness of 1 nm as an electron injecting layer. Then, on this film, Ag and Mg were deposited to a thickness of 10 nm at a film-forming speed ratio of 1:9. Further, ITO was deposited to a thickness of 100 nm. The LiF/Mg:Ag/ITO multilayer film functioned as a second electrode.

By the above-mentioned steps, an organic EL device wherein resonators were formed between the light-reflecting layer and the second electrode (cathode) (optical distance: 132 nm), and between the first electrode and the second electrode (optical distance: 384 nm) was fabricated.

Example 2

An organic EL device was fabricated in the same manner as in Example 1 except that the thickness of the Ag film functioning as a light-reflecting layer was 10 nm.

Example 3

An organic EL device was fabricated in the same manner as in Example 1 except that the thickness of the Ag film functioning as an intermediate light-reflecting layer was 35 nm.

Example 4

An ITO/aluminum film was deposited on a glass substrate as a first electrode in the same manner as in Example 1.

Next, a negative-tone resist IC28T-3 (manufactured by Fujifilm Olin Co., Ltd.) was applied by spin coating, and exposed to ultraviolet rays through a photomask. Non-exposed parts were developed using a xylene developer. The resulting resist was post-baked at 160° C. for 10 minutes to form a resist pattern corresponding to a non-light-emitting region of an organic EL device.

The above substrate with the resist pattern was subjected to ultrasonic cleaning in isopropyl alcohol for 5 minutes, and then cleaned with ultraviolet ozone for 10 minutes.

Next, a SiON film was formed in a thickness of 300 nm on this resist pattern by a CVD method.

Then, the negative-tone resist was removed by using a stripper (N303 manufactured by Nagase & Company, Ltd.) to form a via hole surrounded by an electrical insulative layer on the first electrode.

A metal Ag was deposited through a mask having an opening only corresponding to the via hole so as to fill the inside of the via hole. After removing the mask, an Ag film functioning as a light-reflecting layer was formed in a thickness of 50 nm.

Then, an hole transporting layer, a blue emitting layer, an electron transporting layer and a second electrode were formed in the same manner as in Example 1, thereby fabricating an organic EL device wherein a resonator was formed only between the light-reflecting layer and the second electrode (cathode) (optical distance: 132 nm).

Comparative Example 1

An organic EL device was fabricated in the same as in Example 1 except that the Ag film functioning as a light-reflecting layer was not formed.

Evaluation Example

The reflectances of light-reflecting layers of the organic EL devices fabricated in the above-mentioned examples were measured. Specifically, Ag films were formed on a 0.7 mm thick glass substrate in a thickness of 5 nm (Example 1), 10 nm (Example 2), 35 nm (Example 3) and 50 nm (Example 4) respectively, followed by measuring the reflectances of the Ag film surfaces on the substrates.

The reflectances to blue fluorescence having a peak wavelength of 454 nm generated in the blue emitting layer were 5.8%, 10.7%, 53.5% and 72.9%.

Light-Emitting Performance Evaluation of Organic EL Device

The CIE1931 chromaticities and luminous efficiencies (unit: cd/A) were measured with a spectroradiometer CS1000A (manufactured by Konica Minolta Holdings, Inc.) by applying voltage between the first electrode (anode) and the second electrode (cathode) of the organic EL devices fabricated in Examples 1 to 4 and Comparative Example 1 at a current density of 10 mA/cm$^2$. The results were shown in Table 1.

TABLE 1

|  | CIE chromaticity (x) | CIE chromaticity (y) | Luminous Efficiency (cd/A) |
| --- | --- | --- | --- |
| Example 1 | 0.13 | 0.09 | 3.97 |
| Example 2 | 0.13 | 0.09 | 4.55 |
| Example 3 | 0.13 | 0.11 | 6.80 |
| Example 4 | 0.13 | 0.12 | 4.83 |
| Comparative Example 1 | 0.13 | 0.08 | 3.39 |

The results in Table 1 confirmed that compared with the organic EL device of Comparative Example 1 having a luminous efficiency of 3.39 cd/A, the organic EL devices of the invention exhibited a higher luminous efficiency in the same blue chromaticity region.

INDUSTRIAL APPLICABILITY

The organic EL device according to the invention can be used for display screens of various displays such as consumer televisions, large displays, and displays for portable telephones.

The invention claimed is:

1. An organic electroluminescent device comprising:
a first electrode;
a second electrode; and
an organic material layer interposed between the first electrode and the second electrode;
wherein:
the second electrode is light-transmissible;
the organic material layer comprises a structure wherein a first carrier transporting layer, a conductive light-reflecting layer, another first carrier transporting layer, an organic emitting layer and a second carrier transporting layer are stacked in order; and
a portion of the device between the light-transmissible second electrode and the light-reflecting layer forms an optical resonator enhancing light emitted from the organic emitting layer.

2. The organic electroluminescent device according to claim 1 wherein a portion of the device between the first electrode and the second electrode and/or a portion of the device between the first electrode and the light-reflecting layer forms an optical resonator enhancing light emitted from the organic emitting layer.

3. The organic electroluminescent device according to claim 1 wherein:
the first carrier transporting layer comprises two or more carrier transporting layers formed of different carrier transporting materials; and
the light-reflecting layer is positioned between different carrier transporting layers.

4. The organic electroluminescent device according to claim 3 wherein a carrier transporting layer of the first carrier transporting layer positioned between the first electrode and the light-reflecting layer is doped with a material having a function of producing carriers.

5. The organic electroluminescent device according to claim 1 wherein the light-reflecting layer is positioned apart from the organic emitting layer by 10 nm or more.

6. A display comprising the organic electroluminescent device of claim 1.

* * * * *